US008206160B2

(12) United States Patent
Kacker et al.

(10) Patent No.: US 8,206,160 B2
(45) Date of Patent: Jun. 26, 2012

(54) COMPLIANT OFF-CHIP INTERCONNECTS FOR USE IN ELECTRONIC PACKAGES

(75) Inventors: Karan Kacker, Atlanta, GA (US); Suresh K. Sitaraman, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 398 days.

(21) Appl. No.: 12/152,149

(22) Filed: May 13, 2008

(65) Prior Publication Data

US 2008/0305653 A1    Dec. 11, 2008

Related U.S. Application Data

(60) Provisional application No. 60/940,184, filed on May 25, 2007, provisional application No. 60/940,152, filed on May 25, 2007.

(51) Int. Cl.
*H01R 12/00*    (2006.01)
(52) U.S. Cl. .......................................................... 439/66
(58) Field of Classification Search .................... 439/66, 439/67, 83, 862; 174/267, 261; 361/760, 361/766
See application file for complete search history.

(56) References Cited

U.S. PATENT DOCUMENTS

| | | | | |
|---|---|---|---|---|
| 4,615,573 | A * | 10/1986 | White et al. | 439/66 |
| 5,763,941 | A * | 6/1998 | Fjelstad | 257/669 |
| 6,063,648 | A * | 5/2000 | Beroz et al. | 438/113 |
| 6,399,900 | B1 * | 6/2002 | Khoury et al. | 174/267 |
| 6,784,378 | B2 | 8/2004 | Zhu et al. | |
| 6,830,461 | B2 * | 12/2004 | Sakamoto et al. | 439/66 |
| 6,890,185 | B1 * | 5/2005 | Kister et al. | 439/66 |
| 6,994,565 | B2 * | 2/2006 | Harper, Jr. | 439/66 |

OTHER PUBLICATIONS

Zhu, Q., et al., "Development of Ghelix structure as off-chip Interconnect," Transactions of the ASME—Journal of Electronic Packaging, vol. 126, pp. 237-246, Jun. 2004.
Lo, G., et al. "G-Helix: Lithography-Based Wafer-Level Compliant Chip-to-Substrate Interconnects," Proc. of 54th Electronic Components and Technology Conference, Las Vegas, NV, Jun. 2004, pp. 320-325.
Kacker, K., et al. "Assembly and Reliability Assessment of Lithography-Based Wafer-Level Compliant Chip-to-Substrate Interconnects" Proc of. 55th Electronic Components and Technology Conference, Orlando, FL, 2005, pt. 1, pp. 545-550.
Kacker, K., et al., "FlexConnects: A Cost-Effective Implementation of Compliant Chip-to-Substrate Interconnects," Proc. of Electronic Components and Technology Conference, Reno, NV, May 29, 2007—Jun. 1, 2007, pp. 1678-1684.

* cited by examiner

*Primary Examiner* — Jean F Duverne
(74) *Attorney, Agent, or Firm* — Thomas, Kayden, Horstemeyer & Risley, LLP

(57) ABSTRACT

Disclosed are apparatus comprising single-path and multiple-path compliant interconnects that are coupled between electrical contacts and that allow for increased electrical performance without compromising mechanical reliability. Exemplary apparatus comprises a conductive vertical anchor coupled at a first end to an electrical contact; and one or more conductive arcuate beams coupled at a first end to a second end of the vertical anchor, and coupled at a second end to a second electrical contact. One electrical contact comprises a die contact pad and the other electrical contact comprises a substrate contact pad. Alternatively, one electrical contact comprises a substrate contact pad and the other electrical contact comprises a printed circuit board contact pad. Also, one electrical contact comprises a die contact pad and the other electrical contact comprises a printed circuit board contact pad. Methods of fabricating the apparatus are also disclosed.

15 Claims, 9 Drawing Sheets

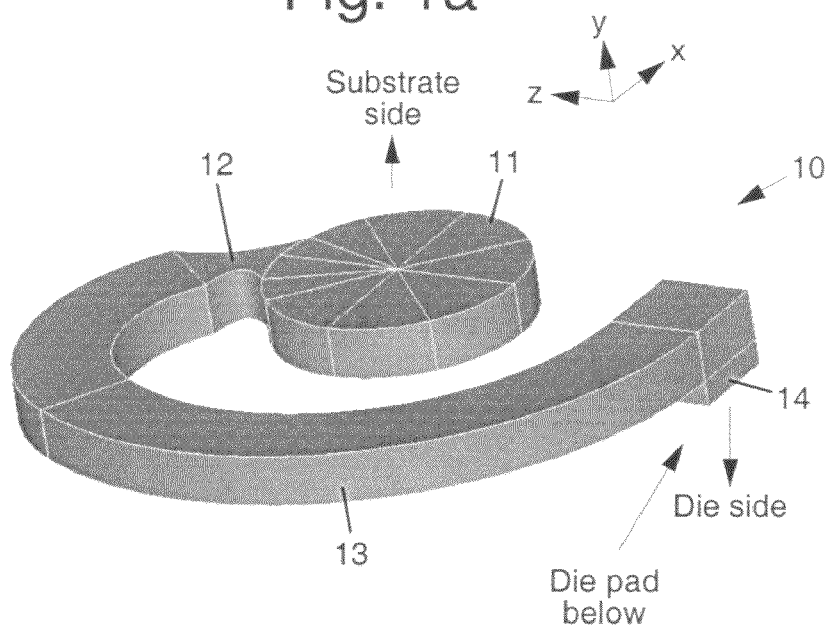
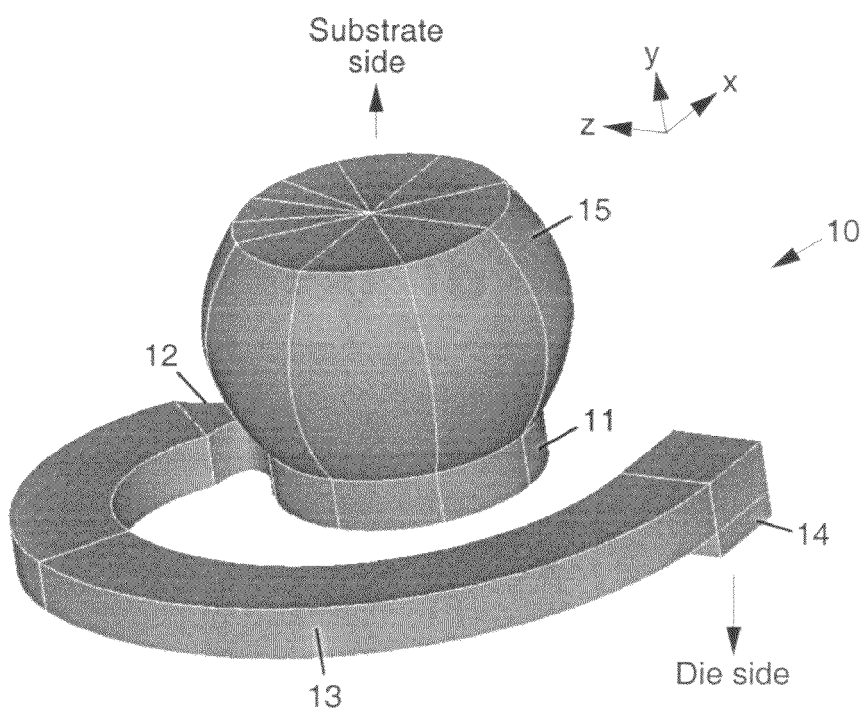

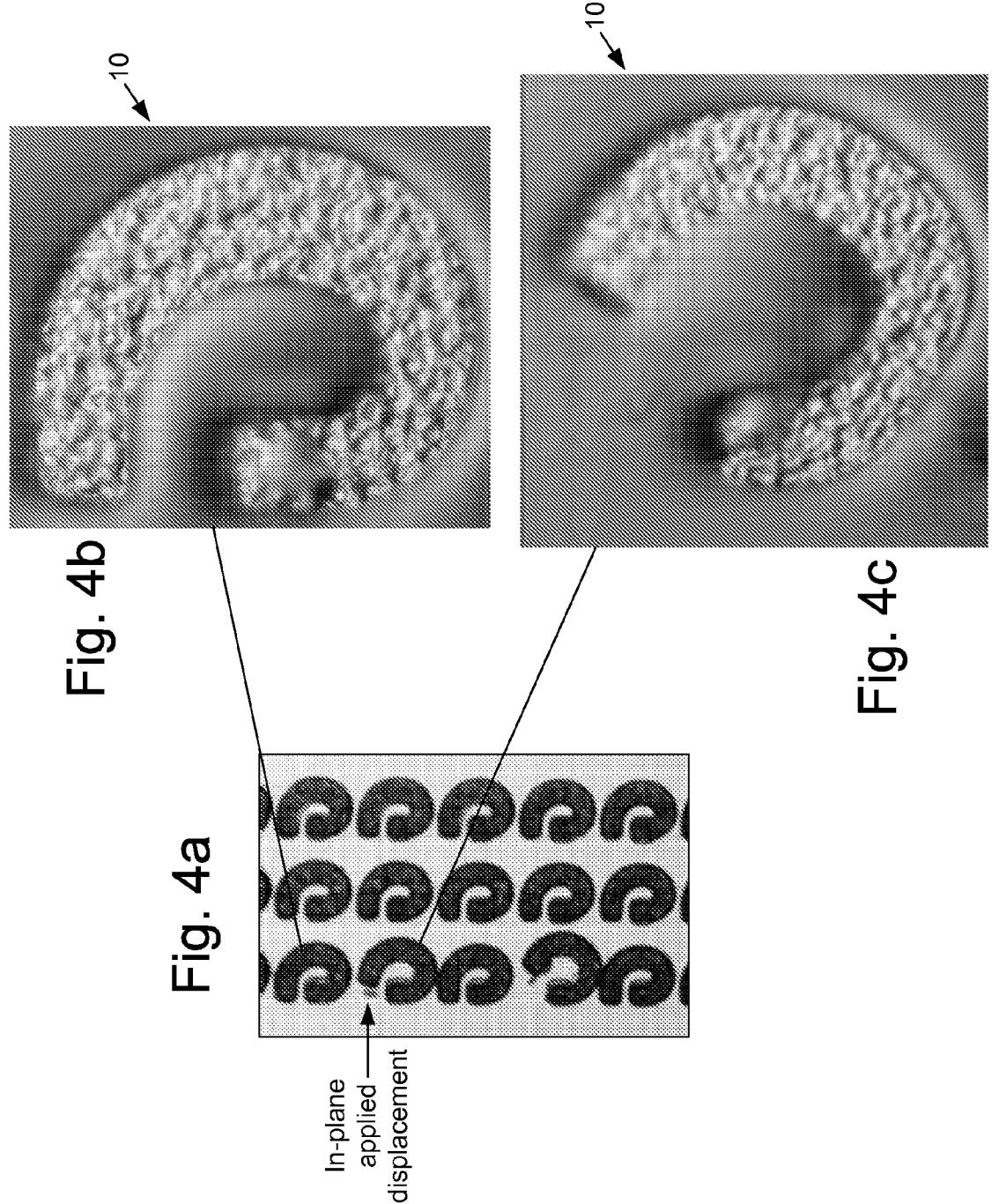

COMPLIANT OFF-CHIP INTERCONNECTS FOR USE IN ELECTRONIC PACKAGES

CROSS-REFERENCE TO RELATED APPLICATION

This application claims priority to U.S. provisional application entitled, "Cost-Effective Compliant Off-Chip Interconnects," having Ser. No. 60/940,184 filed May 25, 2007 now abandoned and U.S. provisional application entitled "Multiple Electrical Path Compliant Interconnects with Improved Mechanical and Electrical Performance for use in Electronic Packages," having Ser. No. 60/940,152, filed May 25, 2007 now abandoned.

STATEMENT REGARDING FEDERALLY SPONSORED RESEARCH OR DEVELOPMENT

This invention was made with government support under Contract/Grant No. ECS-0539023, awarded by the National Science Foundation. The government has certain rights in the invention.

BACKGROUND

The present invention relates generally to compliant interconnects for use in electronic packages and methods for fabricating and designing such compliant interconnects.

Performance, power, size, and cost requirements in the microelectronics industry are pushing for smaller feature sizes, innovative on-chip dielectric materials, higher number of interconnects at a reduced pitch, etc. without compromising the microelectronics reliability. Thus, it is projected by the Semiconductor Industry Association in their International Technology Roadmap for Semiconductors (ITRS) that by the year 2015, the integrated circuit (IC) feature size will shrink to about 10 nm, and therefore, the chip-to-substrate area-array input-output interconnects will require a pitch of 70 µm. Also, as the industry transitions to porous low-K dielectric materials/Cu interconnects to overcome RC delays, it is important to ensure that the stresses induced by the chip-to-substrate interconnects and the package configuration do not crack or delaminate the low-K dielectric material.

Flip chips on organic substrates (FCOBs) with fine-pitch solder bumps are being increasingly used to address performance, power, size, and I/O requirements. FCOBs require underfill to ensure solder bump reliability. However, the added processing costs associated with underfill dispensing and curing, processing challenges especially for fine-pitch assemblies as well as reliability concerns due to underfill delamination make FCOBs a less likely option for future generations of microelectronic packaging. Furthermore, when low-K dielectric material (ultra low-K dielectric in the future) is used in the IC and when such ICs are assembled on organic substrates, the stiff solder bumps could crack or delaminate the low-K dielectric material under thermal excursions. In contrast to flip chip solder bumps, compliant free-standing structures used as chip-to-substrate interconnects can accommodate the coefficient of thermal expansion (CTE) mismatch between the silicon die and the organic substrate without requiring an underfill material. Similarly, in contrast to second-level solder ball interconnects, compliant free-standing structures used as substrate-to-board interconnects can accommodate the CTE mismatch between the substrate and the printed circuit board without requiring an underfill material. Also, compliant free-standing structures can be used as interconnects between the die and the printed circuit board. In general, such compliant free-standing structures can be used as an interconnect between two electrical contacts and take up a relative displacement between these contacts. Such free-standing interconnects are referred to as compliant interconnects and do not require an underfill material. Although an underfill material is not required, users can optionally use an underfill material with the compliant interconnects.

Accommodation of CTE mismatch without requiring an underfill, interconnects that do not crack or delaminate the low-K dielectric in the die, fine pitch, and high-yield cost-effective fabrication without compromising the reliability are some of the challenges that off-chip interconnects must address in the future. To address these needs, compliant interconnects can be used. However, given the requirements for higher compliance, lower electrical parasitics, finer pitch, no-underfill and reworkability, compatibility with low-k dielectrics, and cost effective fabrication—there are no compliant interconnects available that meet these requirements simultaneously.

The assignee of the present invention has previously developed a compliant interconnect technology, referred to as G-Helix. This is discussed, for example, by Zhu, Q., Ma, L., and Sitaraman, S. K., "Development of G-helix structure as off-chip Interconnect," *Transactions of the ASME—Journal of Electronic Packaging*, Vol. 126, pp. 237-246, June 2004; Lo, G., and Sitaraman, S. K., "G-Helix: Lithography-Based Wafer-Level Compliant Chip-to-Substrate Interconnects," *Proc. of 54th Electronic Components and Technology Conference*, Las Vegas, Nev., June 2004, pp. 320-325; and Kacker, K., Lo, G., and Sitaraman, S. K., "Assembly and Reliability Assessment of Lithography-Based Wafer-Level Compliant Chip-to-Substrate Interconnects" *Proc. of. 55th Electronic Components and Technology Conference*, Orlando, Fla., 2005, pt. 1, pp. 545-550. The G-Helix compliant interconnect technology is also described in U.S. Pat. No. 6,784,378 assigned to the assignee of the present invention.

G-Helix is a lithography-based electroplated compliant interconnect that can be fabricated at the wafer level. Results previously presented by the inventors such as disclosed by Zhu, Q., Ma, L., and Sitaraman, S. K., "Development of G-helix structure as off-chip Interconnect," *Transactions of the ASME—Journal of Electronic Packaging*, Vol. 126, pp. 237-246, June 2004, Lo, G., and Sitaraman, S. K., "G-Helix: Lithography-Based Wafer-Level Compliant Chip-to-Substrate Interconnects," *Proc. of 54th Electronic Components and Technology Conference*, Las Vegas, Nev., June 2004, pp. 320-325, and Kacker, K., Lo, G., and Sitaraman, S. K., "Assembly and Reliability Assessment of Lithography-Based Wafer-Level Compliant Chip-to-Substrate Interconnects" *Proc of. 55th Electronic Components and Technology Conference*, Orlando, Fla., 2005, pt. 1, pp. 545-550, indicate that it is a promising technology. However, this technology has two drawbacks. First, a three mask fabrication process with three electroplating steps is utilized in the fabrication of G-Helix interconnects. Such a process is relatively expensive and limits the viability of the G-Helix technology. By decreasing the number of masking/electroplating steps the viability of a compliant interconnect technology can be enhanced by improving its cost-effectiveness.

Second, the inductance of the G-Helix interconnect is high and it is desirable to reduce the inductance. A potential solution should achieve both cost-effectiveness and electrical performance without compromising on mechanical performance. Also, a potential solution should be scalable to fine pitch requirements as projected for off-chip interconnects in the ITRS roadmap.

Mechanical performance refers to mechanical compliance and thermo-mechanical reliability of the interconnects. Better electrical performance is qualitatively described in terms of lower resistance and inductance of the interconnects.

It would be desirable to have improved packaging techniques and methods and utilize compliant interconnects with multiple electrical paths in an electronic package. This would improve the mechanical reliability of electronic packages in a cost-effective manner, without compromising on electrical performance.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIGS. 1a and 1b illustrate exemplary single-path compliant interconnects;

FIGS. 4a-4c illustrate the robustness of the compliant interconnects and show undeformed and deformed interconnects before and after an applied deformation force;

DETAILED DESCRIPTION

Figure 2A:
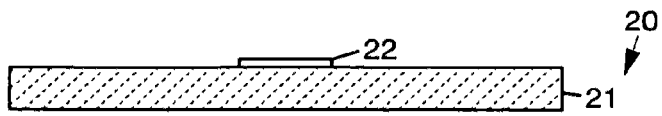
FIGS. 2a-2k illustrate an exemplary process flow for fabricating compliant interconnects.

Referring to the drawing figures, disclosed herein is improved compliant interconnect technology, which may be referred to as FlexConnects™ or FlexConnect™ compliant interconnects 10, that addresses the concerns discussed in the Background section. Both single-path (FIGS. 1a and 1b), parallel-path (FIGS. 6a and 6b), and multiple path (FIGS. 9a and 9b) compliant interconnects 10 are disclosed. Exemplary fabrication methods 20 or processes 20 (FIGS. 2a-2k) are also disclosed.

The compliant interconnects 10, unlike conventional solder bumps, for example, can accommodate the CTE mismatch between a silicon die and an organic substrate without requiring underfill material. The compliant interconnect technology provides the benefits of the G-Helix compliant interconnects previously developed by the present inventors. However, the FlexConnects™ compliant interconnects 10 are different from the G-Helix version, in that they have a different design, resulting in improved electrical performance without compromising on mechanical reliability and require a fewer number of processing steps to fabricate, making them cost-effective for mass-fabrication. The FlexConnects™ use parallel/multiple electrical paths as part of the compliant interconnect design. Sequential photolithography (two masking steps) and one electroplating step are preferably used to fabricate the compliant interconnects 10, and a patterned photosensitive layer is preferably used to simultaneously define openings in a passivation layer on a die and provide a stand-off for the compliant interconnects 10, thus reducing the number of processing steps.

The compliant interconnects 10 have a number of advantages. The compliant interconnects 10 exert minimal force on die pads, and therefore, will not crack or delaminate low-K dielectric material on the die. The compliant interconnects 10 do not require underfill material to accommodate the CTE mismatch between the die and organic substrate, and because no underfill is used, the interconnects are easily reworkable. The compliant interconnects 10 may be fabricated at a wafer-level and therefore are cost-effective. Also, fabrication of the compliant interconnect 10 uses a conventional wafer fabrication infrastructure, so there are no additional equipment or infrastructure costs. The compliant interconnects 10 are fabricated using lithography and electroplating processes, so the interconnects 10 are scalable, and interconnect dimensions and shape can be varied across a chip or die to accommodate electrical, mechanical, and thermal requirements. Lead-free solder may be used for interconnection to substrates, and therefore, the technology is environmentally friendly. Similar to chip-substrate interconnects, the compliant interconnects can be fabricated on a package substrate to create package-to-board second-level interconnects.

Figure 8A:
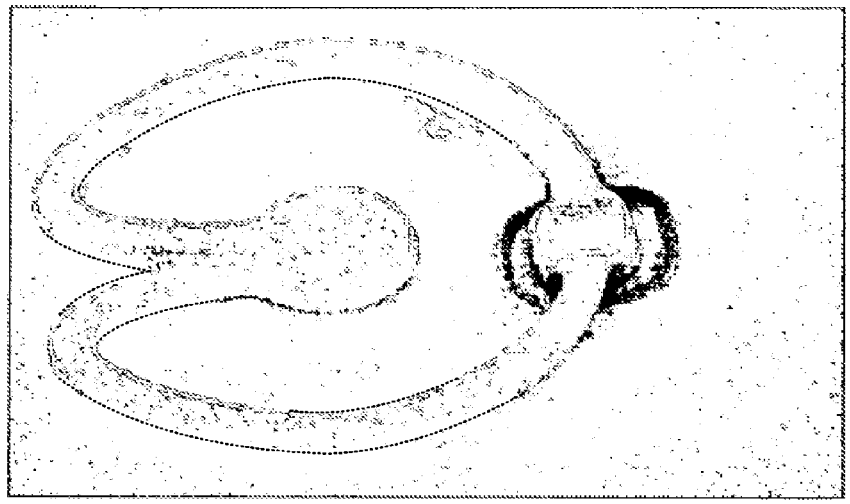
FIGS. 8a-8c are pictorial views of exemplary fabricated parallel-path compliant interconnects.
Figure 8B:
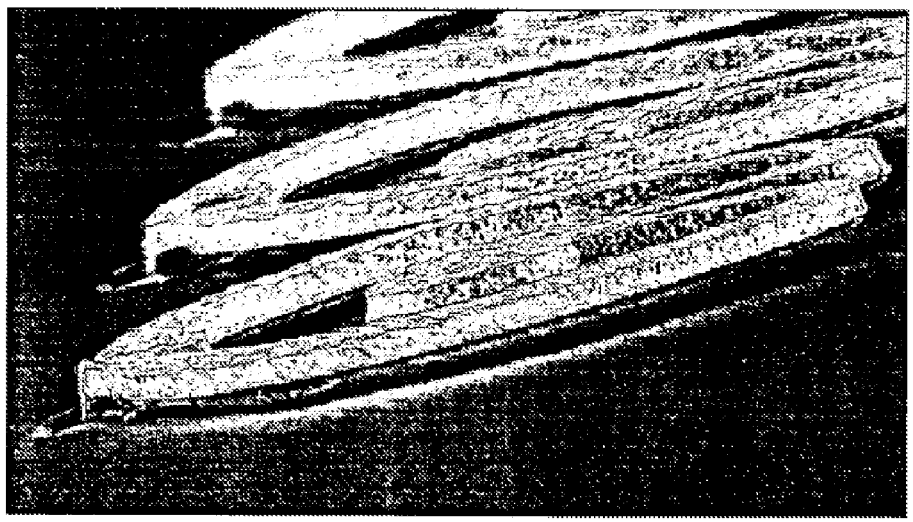

The viability of the fabrication process 20 has been demonstrated by fabricating compliant interconnects 10 at a 100 μm pitch (FIGS. 3 and 8). The compliant interconnects 10 have superior electrical performance compared to the previously-developed G-Helix interconnects. Through numerical simulations, it has been shown that the improved electrical performance of the compliant interconnects 10 is not at the expense of their mechanical performance. For example, with regard to parallel-path compliant interconnects 10, numerical simulations show that their electrical performance is considerably enhanced without compromising their mechanical performance.

It is to be understood that the compliant interconnects 10 may be fabricated on a "panel" that comprises a die, a substrate, a printed circuit board, multiple die, multiple substrates, multiple printed circuit boards, or combinations thereof. The "panel" may include multiple electrical contacts.

Single-Path Compliant Interconnects

Schematic representations of exemplary single-path compliant interconnects 10 are shown in FIGS. 1a and 1b. A horizontal arcuate structure 13 (or arcuate beam 13) is employed which connects to die contact pads via a vertical anchor structure 14. The end of the arcuate beam 13 preferably has a circular pad 11. This is used during chip assembly, to provide a surface for solder to wet the arcuate beam 13. Also, a neck 12 is provided that transitions from the circular pad 11 to the arcuate beam 13. This ensures that solder only wets the circular pad 11 and not the arcuate beam 13.

Solder should not wet the arcuate beam 13, as such a wetting detrimentally impacts the compliance of the interconnect 10. FIG. 1a illustrates a compliant interconnect 10 with a circular pad 11. In this case, for the purpose of chip-to-substrate assembly, solder paste is deposited on substrate pads, and the chip and compliant interconnect 10 are assembled onto the substrate using a reflow process. FIG. 1b illustrates an alternative assembly scheme in which a solder bump 15 is electroplated on the interconnect pads 11, and the chip with the interconnects 10 is assembled on the substrate with or without solder paste on the substrate pads.

Copper is preferably used as the interconnect material because it has low electrical resistivity which results in improved power distribution and device performance as well as reduced cross talk. Copper also has good electromigration properties. Copper is also relatively inexpensive and easy to electroplate.

Interconnect Fabrication

Representative fabrication processes 20 for fabricating the compliant interconnects 10 illustrated in FIGS. 1a and 1b are illustrated in FIGS. 2a-2k. The steps shown in FIGS. 2a-2h may be used to fabricate the compliant interconnect 10 shown in FIG. 1a. The steps shown in FIGS. 2a-2f and 2i-2k may be used to fabricate the compliant interconnect 10 shown in FIG. 1b.

Figure 2B:
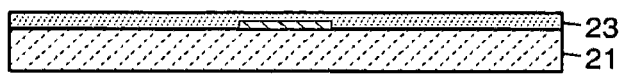
Figure 2C:
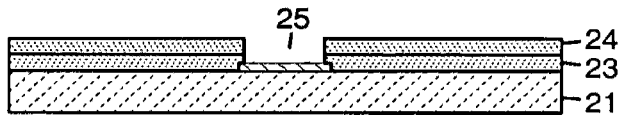
Figure 2D:
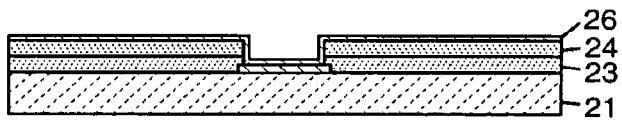
Figure 2E:
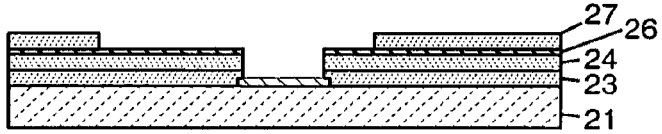
Figure 2F:
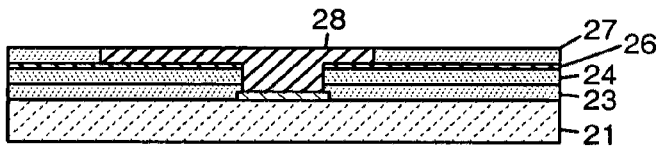
Figure 2G:
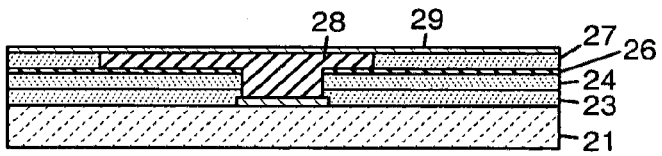
Figure 2H:
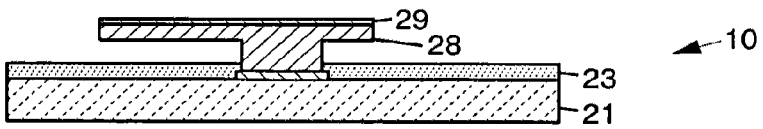

On a given panel 21 with electrical contacts 22 (FIG. 2a), a dielectric passivation layer 23 is deposited (FIG. 2b). Examples of materials that may be used as the passivation layer 23 include $SiO_2$, SiN, and polyimide. For example, $SiO_2$ is plasma enhanced chemical vapor deposition (PECVD) deposited as the passivation layer 23. This is followed by depositing and patterning a photosensitive layer 24 (polymer or epoxy, for example) to define openings 25 in the passivation layer 24 (FIG. 2c). A 3 μm thick, for example, NR7-1500p™ (supplied by Futurrex) photoresist layer 24 is preferably used for this step. NR7-1500p™ is used because of its dimensional stability at high temperatures. A seed metal layer 26 (Ti/Cu/Ti, for example) is then deposited to facilitate deposition of copper for the interconnect structure (FIG. 2d). A second photosensitive layer 27 is then deposited and patterned to define the arcuate structure 13, the neck 12, and the circular pad 11 of FIGS. 1a and 1b (FIG. 2e). An 8 μm thick, for example, NR9-8000p™ (supplied by Futurrex) photoresist layer 27 may be used for this step. Metal 28, such as copper, for example, is then electroplated, filling the pattern defined both by the first and second photosensitive layers 24, 27 (FIG. 2f). In this manner, both the vertical anchor 14 and the arcuate beam 13, neck 12, and circular pad 11 are fabricated in a single step. The resulting structure is shown in FIG. 1a. Alternatively, the structure in FIG. 1a can also be realized by modifying the fabrication process. The steps illustrated in FIGS. 2a-2d can be repeated. Then, a metal, such as copper, can be electroplated to fill the first photosensitive layer 24. The steps illustrated in FIGS. 2e-2h can then be performed to realize the structure shown in FIG. 1a. For the purpose of assembly, solder suitable interface metallurgies 29 (e.g., Ni/Au) are deposited on the top surface of the arcuate beam 13 (FIG. 2g). The interconnect 10 is then released by etching or stripping the photosensitive layers 24, 27 and the seed layer 26 (FIG. 2h). In this manner, the free-standing compliant interconnect 10 illustrated in FIG. 1a is realized.

Figure 2I:
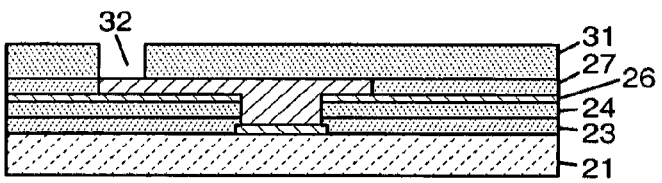
Figure 2J:
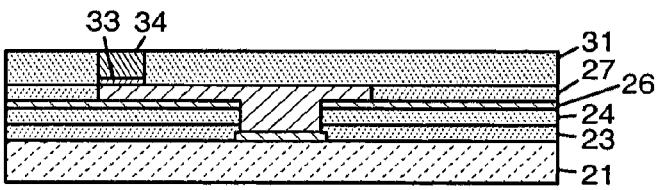
Figure 2K:
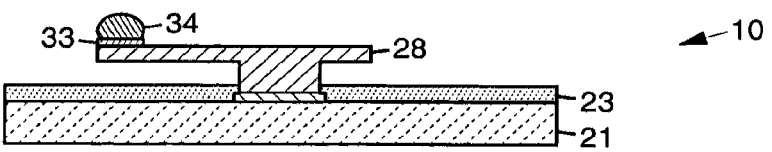

To realize the compliant interconnect 10 shown in FIG. 1b, the steps illustrated in FIGS. 2a-2f are repeated, and the remaining steps are as follows. After the step shown in FIG. 2f, a third photosensitive layer 31 is deposited and patterned to define an opening 32 to the circular pad 11 of FIG. 1b (FIG. 2i). Suitable interface metallurgies 33 (e.g., Ni) for the purpose of assembly using solder can then be deposited on the top surface of the circular pad 11. This is followed by depositing solder 34 into the mold defined by opening 32 in the third photosensitive layer 31 (FIG. 2j). The interconnect 10 is then released by etching or stripping the photosensitive layers 24, 27, 31 and the seed layer 26. The solder is reflowed once the interconnect 10 is released (FIG. 2k). In this manner, the free-standing compliant interconnect 10 illustrated in FIG. 1b is realized.

Fabrication Results

Figure 3A:
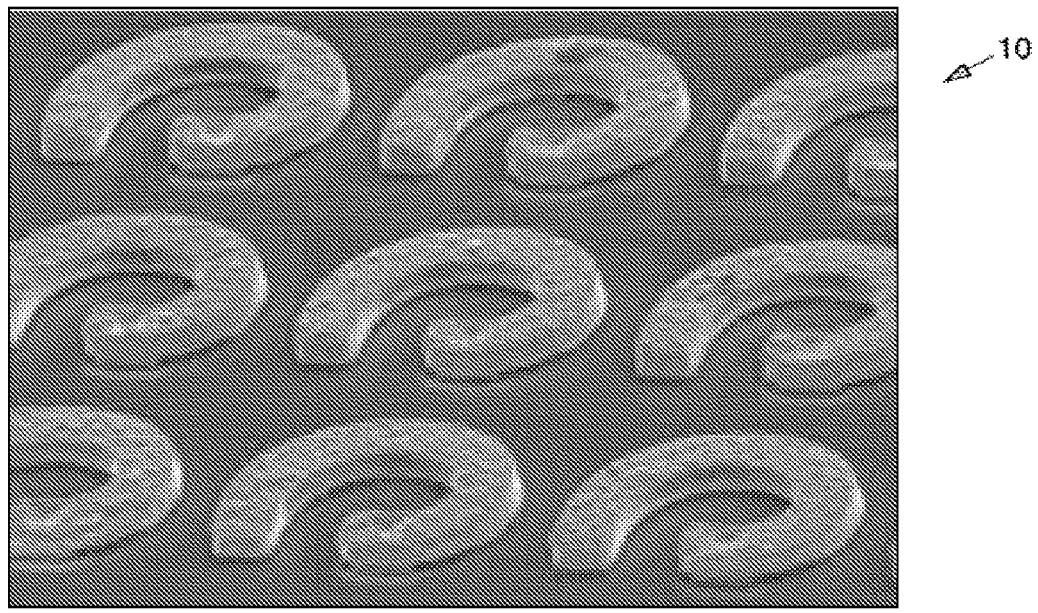
FIGS. 3a and 3b illustrate pictorial views of exemplary fabricated single-path compliant interconnects.
Figure 3B:
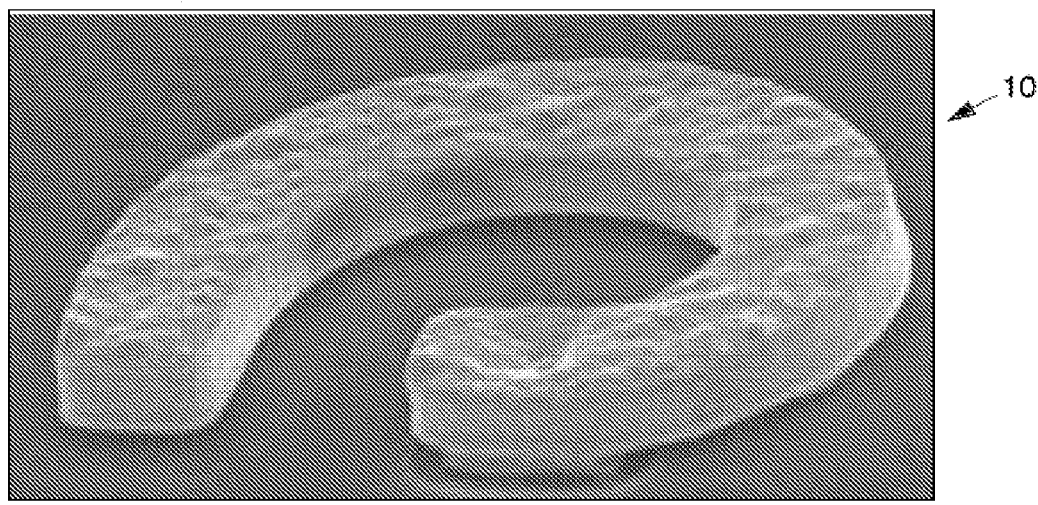

Using the fabrication process 20 described with reference to FIG. 2a-2h, prototype compliant interconnects 10 were fabricated at a 100 μm pitch as shown in FIGS. 3a and 3b. Differences between the compliant interconnect 10 illustrated in FIG. 1a and the prototype compliant interconnects 10 shown in FIGS. 3a and 3b are that the fabricated prototype compliant interconnects 10 do not have a neck 12 and circular pad 11 as shown in FIG. 1a. The fabricated prototype compliant interconnects 10 were found to be uniform and repeatable. To demonstrate robustness of the fabricated compliant interconnects 10, a compliant interconnect 10 was intentionally deformed as shown in FIGS. 4a-4c. FIG. 4b shows an undeformed compliant interconnect 10 and FIG. 4c shows a deformed compliant interconnect 10.

When the free-standing compliant interconnect 10 was pushed sideways, it did not break or delaminate from the silicon wafer. The excessive deformation was applied to demonstrate the robustness of the fabricated structure, and is not representative of actual thermo-mechanical deformations experienced by interconnects 10 in a packaging assembly. These fabrication results demonstrate the viability of the fabrication process 20.

Single-Path Compliant Interconnects Design Characterization

The mechanical performance of the compliant interconnect 10 may be characterized in terms of its diagonal compliance $((c_x^2+c_z^2)/2)^{0.5}$. The terms 'x' and 'z' are in-plane directions as shown in FIGS. 1a and 1b. A more detailed explanation of diagonal compliance is provided in the paper by Lo et al. cited above. To determine the diagonal compliance, the interconnects 10 are modeled in ANSYS® using solid elements. The interconnects 10 are modeled using a linear elastic material model with properties corresponding to copper. The elastic modulus is taken as 103.4 GPa and Poisson's ratio as 0.34.

Loading conditions correspond to completely constraining one end of the compliant interconnect 10. In-plane displacements are imposed on the nodes at the other end of the compliant interconnect 10. The resulting reaction forces are obtained and the compliance calculated as the ratio of the applied displacement to force.

The electrical performance is qualitatively described in terms of resistance and inductance of the compliant interconnect 10. The resistance and self-inductance of the compliant interconnect 10 were determined through numerical simulations using the well-known FastHenry program. The resistivity of copper was selected as $1.772 \times 10^{-6}$ Ω-cm. The electrical and mechanical performance characteristics of the single-path interconnect 10 was determined. The results are summarized in Table 1.

TABLE 1

Electrical and mechanical characteristics of compliant interconnects

| | Cx (mm/N) | Cz (mm/N) | Cd (mm/N) | $R_{DC}$ (mΩ) | $L_{self}$ (pH) |
|---|---|---|---|---|---|
| Single-Path Design | 0.53 | 1.03 | 0.82 | 31.48 | 58.8 |

The single-path compliant interconnect 10 has good electrical characteristics. However, its mechanical compliance should be increased to reduce the stresses transferred to the die and to accommodate the CTE mismatch. One way to increase the compliance will be to use multiple paths for the arcuate structure without changing the fabrication steps.

Parallel-Path Compliant Interconnect Design

Figure 5A:
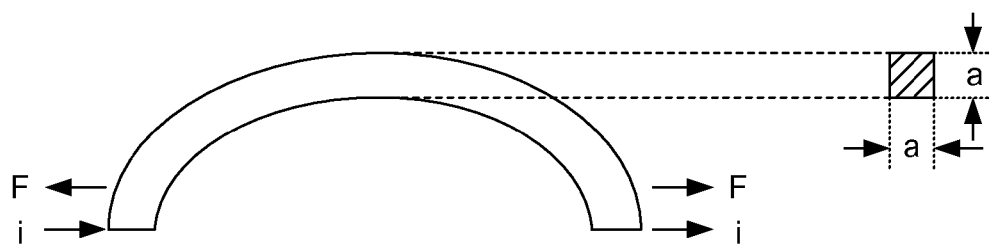
FIGS. 5a and 5b illustrate beam structure dimensions for exemplary compliant interconnects.

The compliant interconnect 10 is a structure that performs both electrical and mechanical functions. Almost all compliant interconnect technologies developed previously employ a single electrical path. However, there are benefits in using two or more electrical paths. To illustrate this, as an example, consider a semi-circular beam, which has both an electrical and a mechanical function. The beam (FIG. 5a) experiences a mechanical load due to a force 'F' and also conducts a current 'i' from one end of the beam to the other. The beam has a square cross-section with its height H and its width W are equal to a. The flexural rigidity 'S' of the beam is proportional to $a^4$.

The compliance 'C' of the structure is given by $$C \propto \frac{F}{S} \propto \frac{F}{a^4}.$$

The electrical resistance of the structure is inversely proportional to its cross-section and is given by $$R \propto \frac{1}{A} \propto \frac{1}{a^2}.$$

Figure 5B:
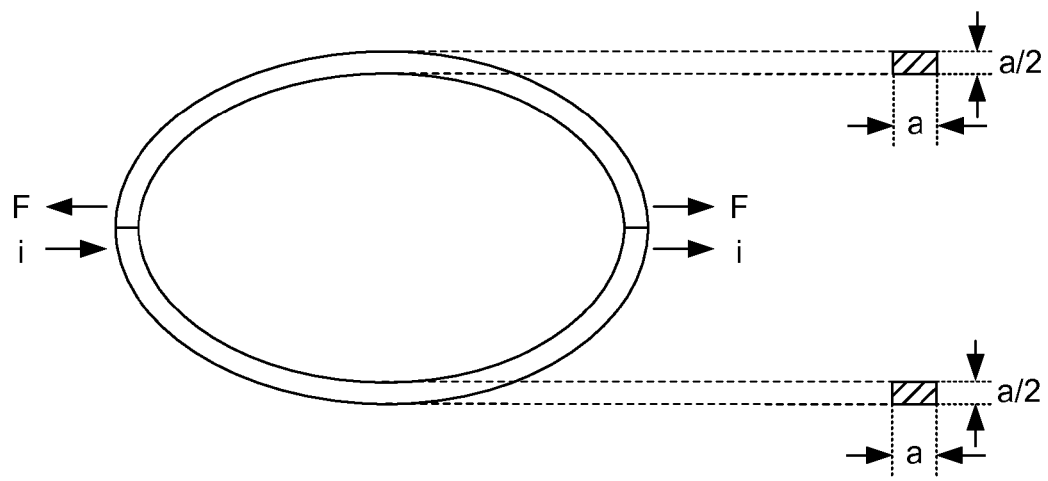

The beam is cut through the middle along its length (FIG. 5b), creating two electrical paths. The second path is mirrored, creating a generally circular geometry. The flexural rigidity 'S' is $$S' \propto a\left(\frac{a}{2}\right)^3 + a\left(\frac{a}{2}\right)^3 \propto \frac{a^4}{4},$$

and the compliance is $$C' \propto \frac{F}{S'} \propto \frac{4F}{a^4}.$$

The resistance is $$R' \propto \frac{1}{A'} \propto \frac{1}{a\left(\frac{a}{2}\right) + a\left(\frac{a}{2}\right)} \propto \frac{1}{a^2}.$$

Hence, $$\frac{C'}{C} = 4 \text{ and } \frac{R'}{R} = 1.$$

Figure 9A:
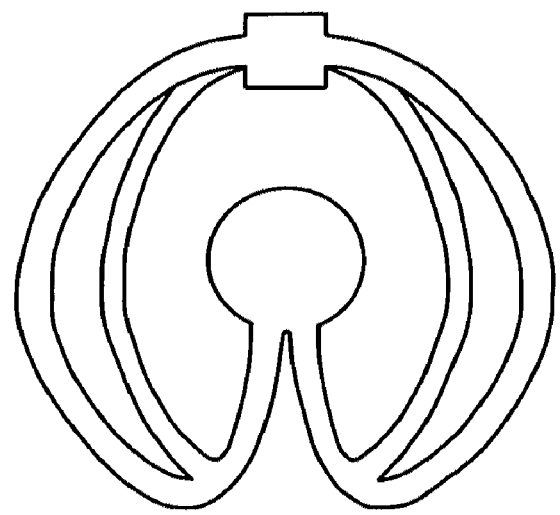
FIGS. 9a and 9b illustrate pictorial views of exemplary multiple-path compliant interconnects.
Figure 9B:
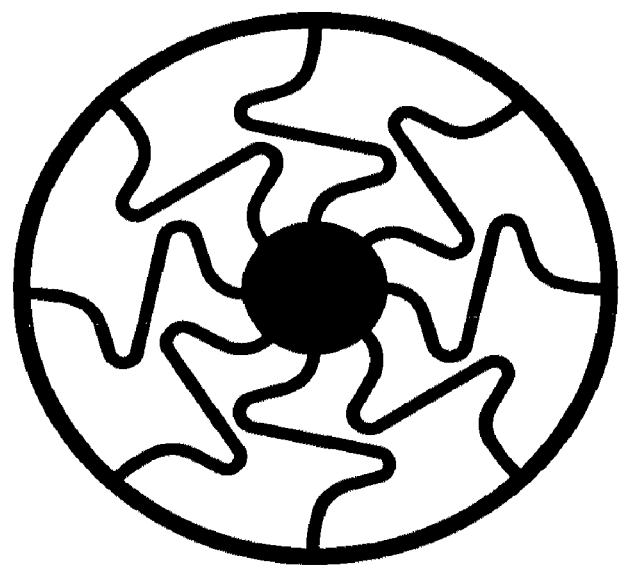

This means that the electrical resistance remains the same, whereas the compliance is 4 times its previous value. Thus, by using two electrical paths, an opportunity exists to achieve the same electrical performance as a single-path compliant interconnect 10 while obtaining improved mechanical compliance. Stated differently, using parallel-path compliant interconnects 10, if one were to keep the mechanical compliance the same as single-path compliant interconnect 10, the electrical performance of the parallel-path compliant interconnect 10 will be superior over the single-path compliant interconnect 10. The concept of using parallel-path compliant interconnects can be extended by using multiple paths as part of the interconnect design, as illustrated in FIGS. 9a and 9b.

Parallel-Path Compliant Interconnect Design

Figure 6A:
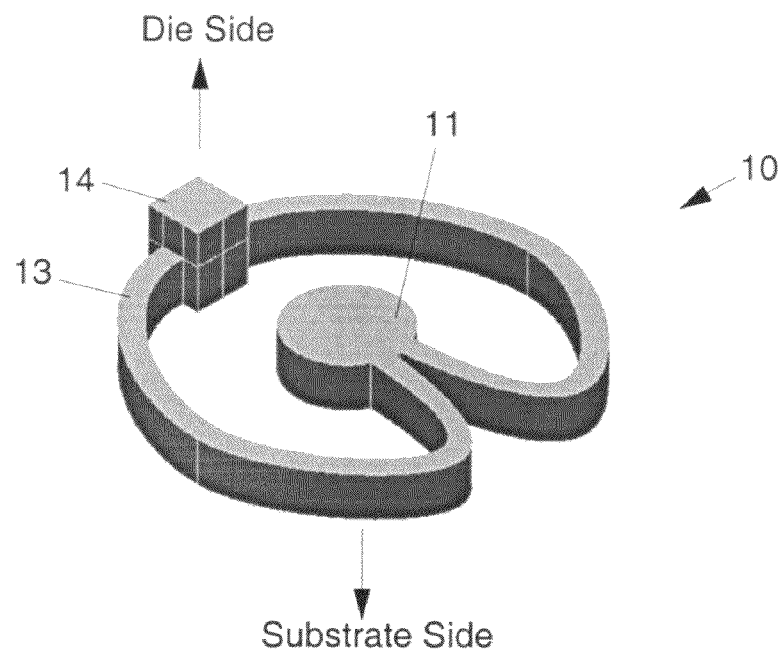
FIGS. 6a and 6b illustrate an exemplary parallel-path compliant interconnect.
Figure 6B:
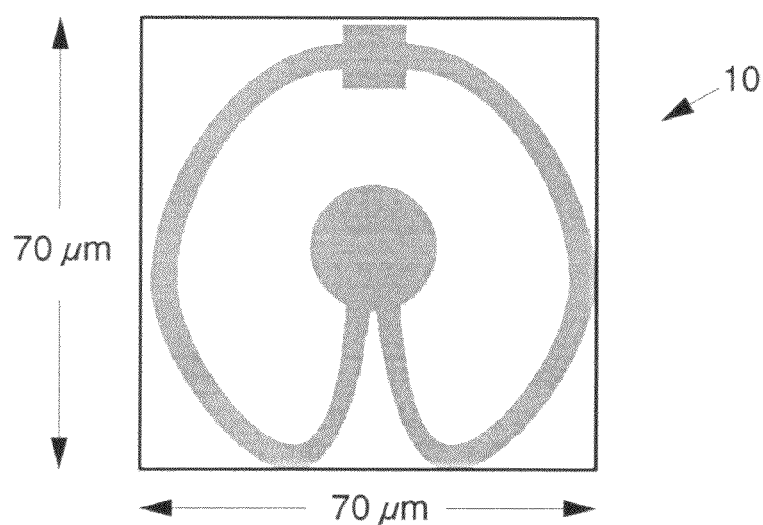

Because the mechanical compliance of the single-path compliant interconnect 10 is low, a parallel-path interconnect 10 was designed using the concepts presented above. A schematic representation of the parallel-path interconnect 10 is shown in FIGS. 6a and 6b. Starting with the vertical anchor structure 14, two horizontal arcuate structures 13, or arcuate beams 13, are fabricated. The ends of the arcuate beams 13 meet at a circular pad 11. The transition from the relatively thin arcuate beams 13 to the larger circular pad 11 serves the purpose of the neck 13 shown in FIGS. 1a and 1b. The thickness of the arcuate beams 11 of the parallel-path compliant interconnect 10 is same as that of the single-path compliant interconnect 10 shown in FIGS. 1a and 1b. However, the width of each individual beam 13 of the parallel-path compliant interconnect 10 is about $\frac{1}{3}^{rd}$ that of the single-path compliant interconnect 10. Also, the curvature of the arcuate structure 13 was modified to accommodate pitch requirements.

Figure 7A:
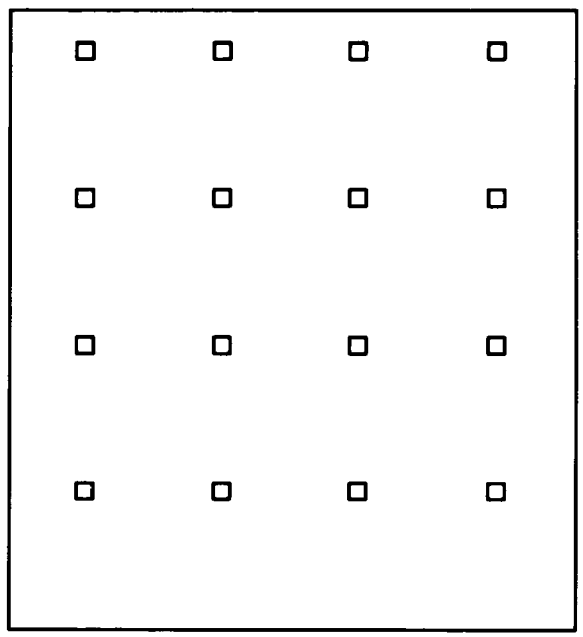
FIGS. 7a and 7b illustrate mask designs for fabricating an exemplary parallel-path compliant interconnect.
Figure 7B:
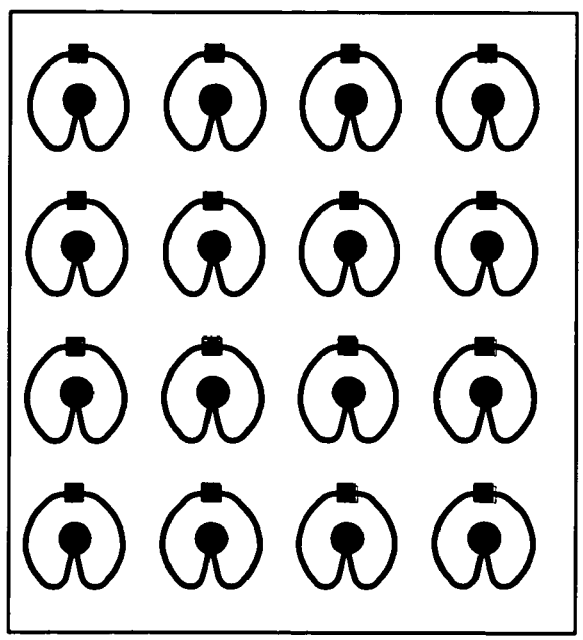
Figure 8C:
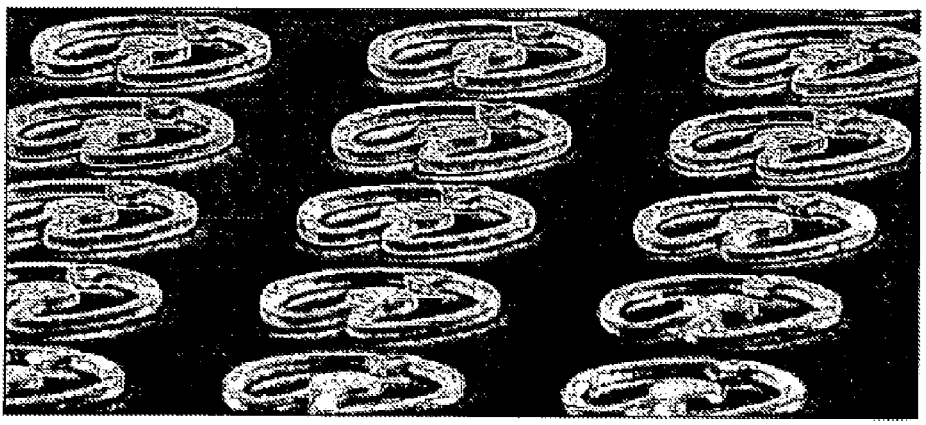

To fabricate the parallel-path compliant interconnects 10, the process 20 outlined in FIGS. 2a-2k may be used. For the first masking step (FIG. 2c), the mask may be comprised of squares with the same dimensions as that of the vertical anchor structure 14. A schematic illustration of the 1st layer mask is shown in FIG. 7a. This masking step may also be used to define openings in the passivation layer. Although square openings are shown in this example, openings of other geometric shapes (circular, oval, etc.) are also realizable. The second masking step (FIG. 2e) defines the two arcuate beams 13 and the copper pad 11 at the end of the arcuate beams 13. A schematic illustration of the 2nd layer mask is shown in FIG. 7b. Fabricated parallel-path compliant interconnects are shown in FIGS. 8a and 8c.

The mechanical compliance and the electrical parasitics of the parallel-path compliant interconnects 10 were determined using the procedure discussed above. The results are summarized in Table 2. As seen, the inductance of parallel-path compliant interconnect 10 is lower than the single-path compliant interconnect 10 (−38%). The parallel-path compliant interconnect 10 has a compliance that is nearly six times that of the single-path compliant interconnect 10. In other words, by using parallel electrical paths, the compliance is increased and at the same time the inductance is decreased.

TABLE 2

Electrical and mechanical characteristics of parallel-path interconnects

|  | Cx (mm/N) | Cz (mm/N) | Cd (mm/N) | $R_{DC}$ (mΩ) | $L_{self}$ (pH) |
|---|---|---|---|---|---|
| Single-path Design | 0.53 | 1.03 | 0.82 | 31.48 | 58.8 |
| Parallel-Path Design | 2.15 | 6.47 | 4.82 | 40.94 | 36.5 |

Thus, single-path and multiple-path compliant interconnects for use in fabricating electronic packages, and methods for fabricating such interconnects have been disclosed. It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:

1. An apparatus comprising:
a conductive vertical anchor coupled at a first end to a first electrical contact; and
a conductive arcuate beam coupled at a first end to a second end of the vertical anchor and coupled at a second end to a second electrical contact via a neck transition that is thinner in cross-section than the arcuate beam and the second electrical contact, where the second end of the conductive arcuate beam is coupled to a side of the second electrical contact that is substantially opposite the conductive vertical anchor.

2. The apparatus recited in claim 1 wherein one electrical contact comprises a die contact pad and the other electrical contact comprises a substrate contact pad.

3. The apparatus recited in claim 1 wherein one electrical contact comprises a substrate contact pad and the other electrical contact comprises a printed circuit board contact pad.

4. The apparatus recited in claim 1 wherein one electrical contact comprises a die contact pad and the other electrical contact comprises a printed circuit board contact pad.

5. The apparatus recited in claim 1 further comprising a second conductive arcuate beam that is substantially coplanar with the first conductive arcuate beam, the second conductive arcuate beam coupled at a first end to the second end of the conductive vertical anchor and coupled at a second end to the second electrical contact.

6. The apparatus recited in claim 1 further comprising multiple arcuate beams that are substantially coplanar, each of the arcuate beams coupled at a first end to the second end of the conductive vertical anchor and coupled at a second end to the second electrical contact.

7. The apparatus recited in claim 5 wherein the second conductive arcuate beam is coupled at the second end to the second electrical contact via a neck transition.

8. The apparatus recited in claim 5 wherein the first and second conductive arcuate beams curve around opposite sides of the second electrical contact.

9. The apparatus recited in claim 1 further comprising a solder bump disposed on the second electrical contact.

10. An apparatus comprising:
a conductive vertical anchor coupled at a first end to a first electrical contact; and
a plurality of conductive arcuate beams, each conductive arcuate beam coupled at a first end to a second end of the conductive vertical anchor and coupled at a second end to a second electrical contact, where the second end of each conductive arcuate beam is coupled to a side of the second electrical contact that is substantially opposite the conductive vertical anchor.

11. The apparatus recited in claim 10 wherein the plurality of conductive arcuate beams are substantially coplanar.

12. The apparatus recited in claim 11 wherein the plurality of conductive arcuate beams substantially encircle the second electrical contact.

13. The apparatus recited in claim 10 wherein the plurality of conductive arcuate beams includes at least four conductive arcuate beams.

14. The apparatus recited in claim 13 wherein the plurality of conductive arcuate beams includes at least eight conductive arcuate beams.

15. An apparatus comprising:
a conductive vertical anchor coupled at a first end to a first electrical contact; and
a plurality of conductive arcuate beams, each conductive arcuate beam coupled at a first end to a second end of the conductive vertical anchor and coupled at a second end to a second electrical contact;
wherein the plurality of conductive arcuate beams are coupled to the conductive vertical anchor via a ring encircling the second electrical contact, wherein the plurality of conductive arcuate beams are symmetrically distributed about the second electrical contact.

* * * * *